US007982285B2

(12) United States Patent
Park et al.

(10) Patent No.: US 7,982,285 B2
(45) Date of Patent: Jul. 19, 2011

(54) ANTIFUSE STRUCTURE HAVING AN INTEGRATED HEATING ELEMENT

(75) Inventors: Byeongju Park, Poughkeepsie, NY (US); Subramanian S. Iyer, Mount Kisco, NY (US); Chandrasekharan Kothandaraman, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 735 days.

(21) Appl. No.: 11/970,750

(22) Filed: Jan. 8, 2008

(65) Prior Publication Data
US 2008/0111210 A1  May 15, 2008

Related U.S. Application Data

(63) Continuation of application No. 10/988,132, filed on Nov. 12, 2004, now Pat. No. 7,323,761.

(51) Int. Cl.
*H01L 23/52* (2006.01)

(52) U.S. Cl. ........ 257/530; 438/598; 438/599; 438/600; 438/601; 438/131; 438/132; 438/467; 438/215; 438/281; 438/333; 257/529; 257/531; 257/50; 257/928; 257/209; 257/702; 257/E23.147; 257/E29.111; 257/E23.148

(58) Field of Classification Search .......... 438/598–601, 438/131–132, 467, 215, 281, 333; 257/529–531, 257/50, 928, 209, 702, E23.147, E29.111, 257/E23.148
See application file for complete search history.

(56) References Cited

U.S. PATENT DOCUMENTS

| | | | | |
|---|---|---|---|---|
| 4,814,853 A | * | 3/1989 | Uchida | 257/530 |
| 5,163,180 A | * | 11/1992 | Eltoukhy et al. | 257/530 |
| 5,196,724 A | * | 3/1993 | Gordon et al. | 257/530 |
| 5,250,459 A | * | 10/1993 | Lee | 438/600 |
| 5,319,238 A | * | 6/1994 | Gordon et al. | 257/530 |
| 5,412,244 A | * | 5/1995 | Hamdy et al. | 257/530 |
| 5,412,593 A | | 5/1995 | Magel et al. | |
| 5,466,484 A | * | 11/1995 | Spraggins et al. | 438/385 |
| 5,485,031 A | * | 1/1996 | Zhang et al. | 257/530 |
| 5,523,612 A | | 6/1996 | Karpovich | |
| 5,565,702 A | | 10/1996 | Tamura et al. | |
| 5,565,703 A | * | 10/1996 | Chang | 257/530 |
| 5,572,050 A | | 11/1996 | Cohen | |
| 5,592,016 A | * | 1/1997 | Go et al. | 257/530 |
| 5,666,007 A | * | 9/1997 | Chung | 257/751 |
| 5,770,892 A | * | 6/1998 | Chan et al. | 257/393 |
| 5,774,011 A | | 6/1998 | Au et al. | |
| 5,811,870 A | | 9/1998 | Bhattacharyya et al. | |
| 5,854,510 A | * | 12/1998 | Sur et al. | 257/529 |

(Continued)

OTHER PUBLICATIONS

Degraeve, "Temperature acceleration of oxide breakdown and its impact on ultra-thin gate oxide reliability", 1999 Symposium on BLSI Technology Digest of Technical Papers, 1999, pp. 59-60.

(Continued)

*Primary Examiner* — N Drew Richards
*Assistant Examiner* — Ankush k Singal
(74) *Attorney, Agent, or Firm* — Scully, Scott, Murphy & Presser, P.C.; Joseph P. Abate, Esq.

(57) ABSTRACT

The present invention provides antifuse structures having an integrated heating element and methods of programming the same, the antifuse structures comprising first and second conductors and a dielectric layer formed between the conductors, where one or both of the conductors functions as both a conventional antifuse conductor and as a heating element for directly heating the antifuse dielectric layer during programming.

20 Claims, 14 Drawing Sheets

U.S. PATENT DOCUMENTS

| | | | |
|---|---|---|---|
| 5,882,998 A * | 3/1999 | Sur et al. | 438/601 |
| 5,903,041 A | 5/1999 | La Fleur et al. | |
| 5,965,270 A * | 10/1999 | Fang et al. | 428/446 |
| 5,976,943 A * | 11/1999 | Manley et al. | 438/382 |
| 6,033,939 A * | 3/2000 | Agarwala et al. | 438/132 |
| 6,081,021 A * | 6/2000 | Gambino et al. | 257/530 |
| 6,093,937 A | 7/2000 | Yamazaki et al. | |
| 6,180,976 B1 * | 1/2001 | Roy | 257/306 |
| 6,242,335 B1 * | 6/2001 | Sher et al. | 438/600 |
| 6,288,437 B1 * | 9/2001 | Forbes et al. | 257/530 |
| 6,323,534 B1 * | 11/2001 | Marr et al. | 257/529 |
| 6,362,023 B1 * | 3/2002 | Bergemont et al. | 438/131 |
| 6,396,120 B1 * | 5/2002 | Bertin et al. | 257/530 |
| 6,433,404 B1 * | 8/2002 | Iyer et al. | 257/529 |
| 6,437,365 B1 * | 8/2002 | Hawley et al. | 257/50 |
| 6,444,502 B1 * | 9/2002 | Sanchez et al. | 438/131 |
| 6,448,576 B1 * | 9/2002 | Davis et al. | 257/50 |
| 6,458,631 B1 * | 10/2002 | Brintzinger et al. | 438/131 |
| 6,498,056 B1 | 12/2002 | Motsiff et al. | |
| 6,507,087 B1 * | 1/2003 | Yu | 257/529 |
| 6,617,914 B1 | 9/2003 | Kothandaraman | |
| 6,624,031 B2 * | 9/2003 | Abadeer et al. | 438/268 |
| 6,624,499 B2 | 9/2003 | Kothandaraman et al. | |
| 6,627,969 B1 * | 9/2003 | Jain et al. | 257/530 |
| 6,661,330 B1 * | 12/2003 | Young | 337/297 |
| 6,750,530 B1 * | 6/2004 | Klaasen et al. | 257/530 |
| 6,777,270 B2 * | 8/2004 | Perner et al. | 438/131 |
| 6,777,773 B2 | 8/2004 | Knall et al. | |
| 6,788,607 B2 | 9/2004 | Duval et al. | |
| 6,794,726 B2 * | 9/2004 | Radens et al. | 257/530 |
| 6,815,264 B2 * | 11/2004 | Stribley et al. | 438/131 |
| 6,879,021 B1 * | 4/2005 | Fitfield et al. | 257/530 |
| 6,927,472 B2 * | 8/2005 | Anderson et al. | 257/529 |
| 6,944,054 B2 | 9/2005 | Rueckes et al. | |
| 6,958,523 B2 * | 10/2005 | Babcock et al. | 257/538 |
| 6,960,978 B2 * | 11/2005 | Leigh et al. | 337/159 |
| 6,979,879 B1 * | 12/2005 | Yindeepol et al. | 257/530 |
| 7,033,867 B2 * | 4/2006 | Porter | 438/131 |
| 7,157,782 B1 * | 1/2007 | Shih et al. | 257/530 |
| 7,294,904 B1 * | 11/2007 | Chee et al. | 257/528 |
| 7,329,955 B2 * | 2/2008 | Tsau | 257/758 |
| 7,422,972 B2 * | 9/2008 | Babcock et al. | 438/601 |
| 7,659,168 B2 * | 2/2010 | Hsu et al. | 438/281 |
| 2002/0048854 A1 * | 4/2002 | Lee et al. | 438/131 |
| 2002/0117724 A1 * | 8/2002 | Ariyoshi et al. | 257/392 |
| 2003/0160297 A1 * | 8/2003 | Kothandaraman et al. | 257/529 |
| 2003/0201514 A1 | 10/2003 | Radens et al. | |
| 2003/0207570 A1 * | 11/2003 | Perner et al. | 438/689 |
| 2004/0004267 A1 * | 1/2004 | Bunt et al. | 257/529 |
| 2004/0051162 A1 * | 3/2004 | Chidambarrao et al. | 257/530 |
| 2004/0169254 A1 * | 9/2004 | Porter | 257/530 |
| 2005/0110113 A1 * | 5/2005 | Lin et al. | 257/530 |
| 2006/0046354 A1 * | 3/2006 | Kreipl | 438/132 |
| 2006/0102982 A1 | 5/2006 | Park et al. | |

OTHER PUBLICATIONS

C. Kothandaraman et al., "Electrically Programmable Fuse (eFUSE) Using Electromigration in Silicides", IEEE Electron Device Letters, vol. 23, No. 9, Sep. 2002, pp. 523-525.

* cited by examiner

ANTIFUSE STRUCTURE HAVING AN INTEGRATED HEATING ELEMENT

RELATED APPLICATIONS

This application is a continuation of U.S. application Ser. No. 10/988,132, filed on Nov. 12, 2004.

BACKGROUND OF THE INVENTION

The present invention relates to semiconductor structures, and particularly, to antifuse structures having an integrated heating element and methods of programming thereof.

Electrically operable fuses are utilized within the field of integrated circuit devices and processes for a number of purposes, including programming alterable circuit connections, or replacing defective circuit elements with redundant circuit elements. One type of electrically operable fuse, a so-called "antifuse", is a device having two conductors and an intervening dielectric layer, where the dielectric layer is subject to breakdown upon application of sufficient voltage and current to the conductors. The resistance across the dielectric layer of the antifuse encodes the "on" or "off" state of the antifuse.

A typical (pre-breakdown) "off" resistance for antifuses having a dielectric layer of silicon nitride (SiN), "gate oxide", i.e. silicon dioxide (SiO2) formed by the gate oxide forming process, or silicon oxide-silicon oxynitride-silicon oxide (ONO) is more than 1 GΩ. After breakdown, resistance across the dielectric layer is measurably lower, indicating the "on" state. Thus, the on-off state of the antifuse is read using a resistance measuring circuit.

At present, a high voltage and a current of several milliamperes may be required to adequately break down the dielectric of antifuses on an integrated circuit. Such required high currents impose minimum size constraints on the antifuses and wiring thereto, thereby requiring significant integrated circuit area to implement, while also negatively affecting the flow of production testing and repair of new chips. Provisions must also be made to safeguard the integrated circuit from being negatively affected by the required high programming voltage. The high programming voltage may give rise to concerns for electrostatic discharge protection (ESD) and the reliability of the integrated circuit.

In order for the state of an antifuse to be reliably read, the post-breakdown resistance must be in the megaohm range or below and, for yield reasons, this must be achieved for virtually all of the antifuses on the integrated circuit. Gate oxide antifuses typically require currents in the several milliampere range to achieve such post-breakdown resistance. However, such currents and the required high voltage are close to integrated circuit design constraints based on ESD protection and reliability considerations.

Antifuse technology through the use of dielectric breakdown is well understood. For example, U.S. Pat. No. 5,250, 459 (the '459 patent), issued to Lee and entitled "Electrically Programmable Low Resistive Antifuse Element" embodies this concept. FIG. 1 of the '459 patent illustrates a conventional antifuse element 14 comprising a first electrode 11, a dielectric layer 12 and second electrode 13, all fabricated on substrate 10. To program antifuse element 14, that is to change the antifuse element from a high impedance state to a low impedance state, the conventional practice is to damage dielectric layer 12 by applying an electric field across dielectric layer 12 at first electrode 11 and second electrode 13. The electric field, if strong enough, will cause the dielectric layer 12 to breakdown, thus forming a conductive filament between first electrode 11 and second electrode 13. To reliably damage the dielectric layer 12, application of high programming voltages and currents are typically required. Gate oxide antifuses typically require several volts and currents in the several milliampere range to achieve such post-breakdown resistance.

This presents a problem in that the voltage/current required to program the antifuse must pass through standard CMOS logic without damaging it. One conventional solution, for example as described in U.S. Pat. No. 6,750,530 ("the '530 patent"), assigned to the assignee hereof and entitled "Semiconductor Antifuse With Heating Element," is to form a heating element adjacent to, but not part of or in contact with, the antifuse element. Such a solution provides indirect heating, however, no component of the antifuse itself is involved in the generation of the heat. There are several drawbacks to such a solution utilizing indirect heating. First, additional processing steps are required to place a heat generation source in proximity to the antifuse. A resistive heating element (depicted as element 305 in FIG. 6B of the '530 patent) must be placed in the proximity of the antifuse (depicted as element 300 in FIG. 6B of the '530 patent). This requires additional process steps, thus increasing complexity and potential for yield loss. Second, although sufficient heat may be generated, transferring the heat to the antifuse is inefficient because of the indirect nature of the heating that occurs. For example, as illustrated in FIG. 6B of the '530 patent, to raise the temperature of antifuse dielectric layer 330, heat energy must radiate from heating element 305 through thick dielectric layer 340, which is about 0.5 microns thick. This heat transfer path is inefficient and requires a high programming current to travel through heating element 305 to produce sufficient indirect heating of dielectric layer 330. Additionally, the heat energy will disperse radially from heating element 305, thus further reducing the amount of heat energy that will reach the dielectric layer 330. Also, some amount of delay will occur from a point in time when the external heating element is activated to when the heat energy reaches the antifuse element. This delay is a function of both the distance between the external heating element and the antifuse element and the heat transfer characteristics (e.g. thermal conductivity) of the dielectric material that separates the external heating element and the antifuse element. The dielectric material that separates the external heating element and the antifuse element is typically a poor thermal conductor. Heat loss will occur as the heat energy passes through the insulator. Therefore, the size of the external heating element will have to be increased to account for such heat loss. Finally, the overall size of the programmable circuit is increased by adding a separate heating element, thus negatively impacting the size of the integrated circuit on which such antifuse structures reside.

Therefore, a need exists for an integrated, self-heating, less complex, reduced size, and more efficient antifuse structure where the antifuse dielectric layer is heated directly by the antifuse structure itself, not by an external heating element.

BRIEF SUMMARY OF THE INVENTION

The present invention addresses the above-described problems by facilitating direct heating of a dielectric layer of an antifuse. According to the invention, there is provided novel antifuse structures having an integrated heating element and methods of programming thereof. In accordance with one aspect of the invention, a conventional antifuse and a heating element are integrated into a single structure where the heating element facilitates direct heating of a dielectric layer of the antifuse.

There are three distinct embodiments of the antifuse structure having an integrated heating element according to the present invention. The first embodiment describes a structure and method of programming thereof an antifuse structure Having an integrated heating element whereby the heating element is integrated into an upper conductor of the antifuse. This structure provides an antifuse capable of directly heating the dielectric layer of the antifuse in response to a current flowing through the upper conductor. An upper conductor is formed on a dielectric layer. The dielectric layer is formed on a lower conductor and separates the two conductors. The lower conductor is formed in a semiconductor substrate.

The second embodiment describes a structure and method of programming thereof an antifuse structure having an integrated heating element whereby the heating element is integrated into a lower conductor of the antifuse. This structure provides an antifuse capable of directly heating the dielectric layer of the antifuse in response to a current flowing through the lower conductor. A lower conductor is formed in a semiconductor substrate and a dielectric layer is formed on the lower conductor. An upper conductor is formed on the dielectric layer and is separated from the lower conductor by the dielectric layer.

The third embodiment describes a structure and method of programming thereof an antifuse structure having two integrated heating elements whereby a first heating element is integrated into an upper conductor of the antifuse and a second heating element is integrated into a lower conductor of the antifuse. This structure provides an antifuse capable of directly heating a dielectric layer of the antifuse in response to a first current flowing through an upper conductor and a second current flowing through a lower conductor. The lower conductor is formed in a semiconductor substrate and the dielectric layer is formed on the lower conductor. The upper conductor is formed on the dielectric layer and is separated from the lower conductor by the dielectric layer.

The three structures share the common attribute that at least one conductor of the antifuse structure functions as both a conventional antifuse conductor and as a heating element, the heating element facilitating direct heating of the antifuse dielectric layer.

Further embodiments for an antifuse structure having an integrated heating element and methods of programming thereof include the fabrication of the antifuse structure on a silicon-on-insulator (SOI) substrate, for example, the formation in a silicon substrate having a buried insulator layer, e.g., a buried oxide (BOX) layer.

DETAILED DESCRIPTION OF THE INVENTION

Figure 1A:
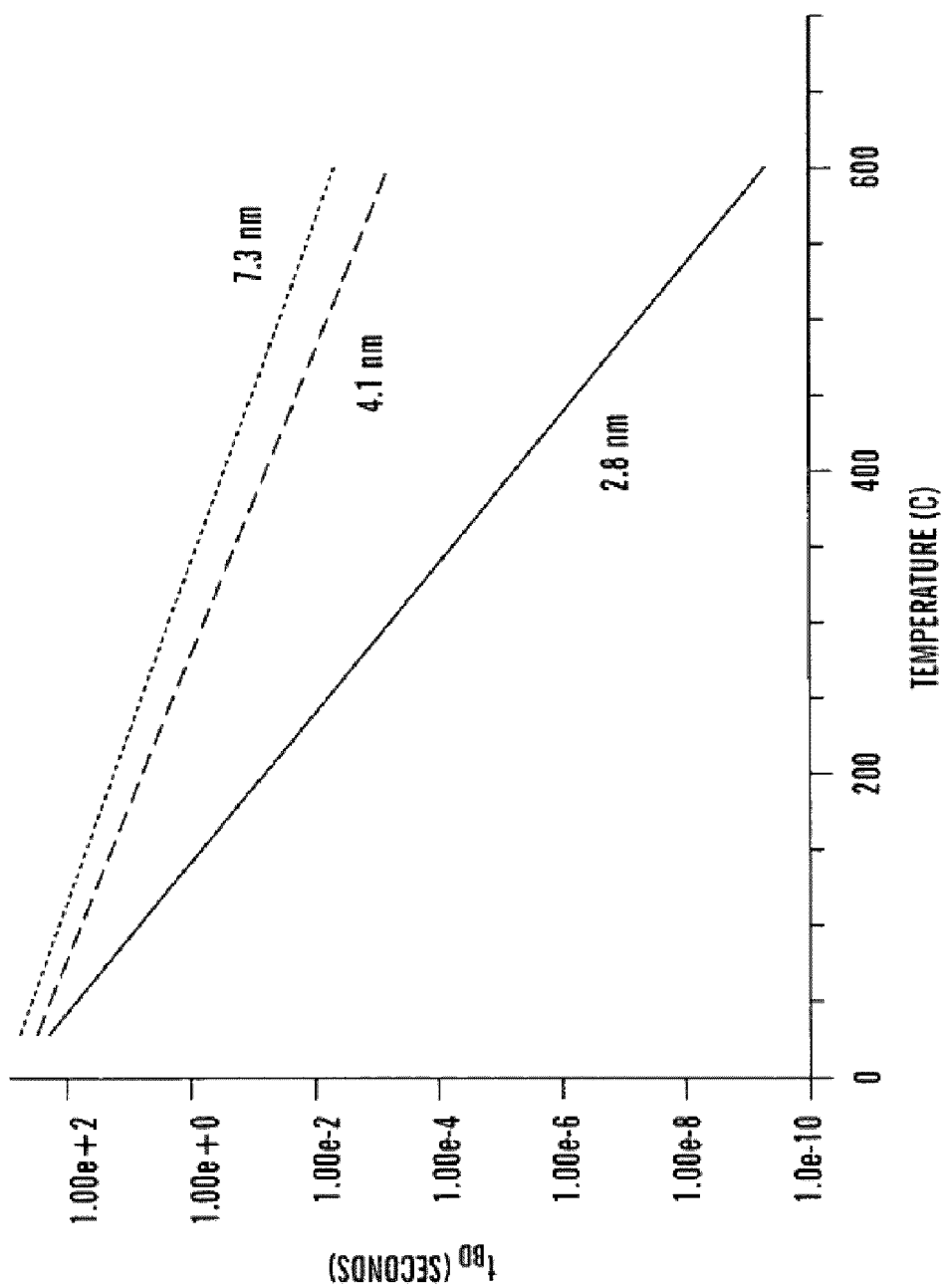
FIG. 1a is a diagram illustrating the effect temperature has on breakdown time for oxides of varying thicknesses.

The present invention provides anti fuse structures having an integrated heating element and methods of programming thereof. It is well known that thin oxides breakdown more rapidly as the temperature to which they are exposed increases. FIG. 1a illustrates the relationship between temperature and time to breakdown ($t_{BD}$) for various oxide thicknesses (7.3 nm, 4.1 nm, and 2.8 nm) where $t_{BD}$ is the amount of time required to breakdown the oxide material. As applied to antifuses, this relationship can be utilized to accelerate the breakdown of the antifuse dielectric layer by raising the temperature of the dielectric layer. When the dielectric layer of the antifuse breaks down, the conductors of the antifuse, which are separated by the dielectric layer, are electrically shorted together, thus programming the antifuse. For example, FIG. 1a illustrates how $t_{BD}$ can be significantly reduced by raising the temperature of the dielectric layer for an antifuse having a fixed programming voltage of 4.7V.

Figure 1B:
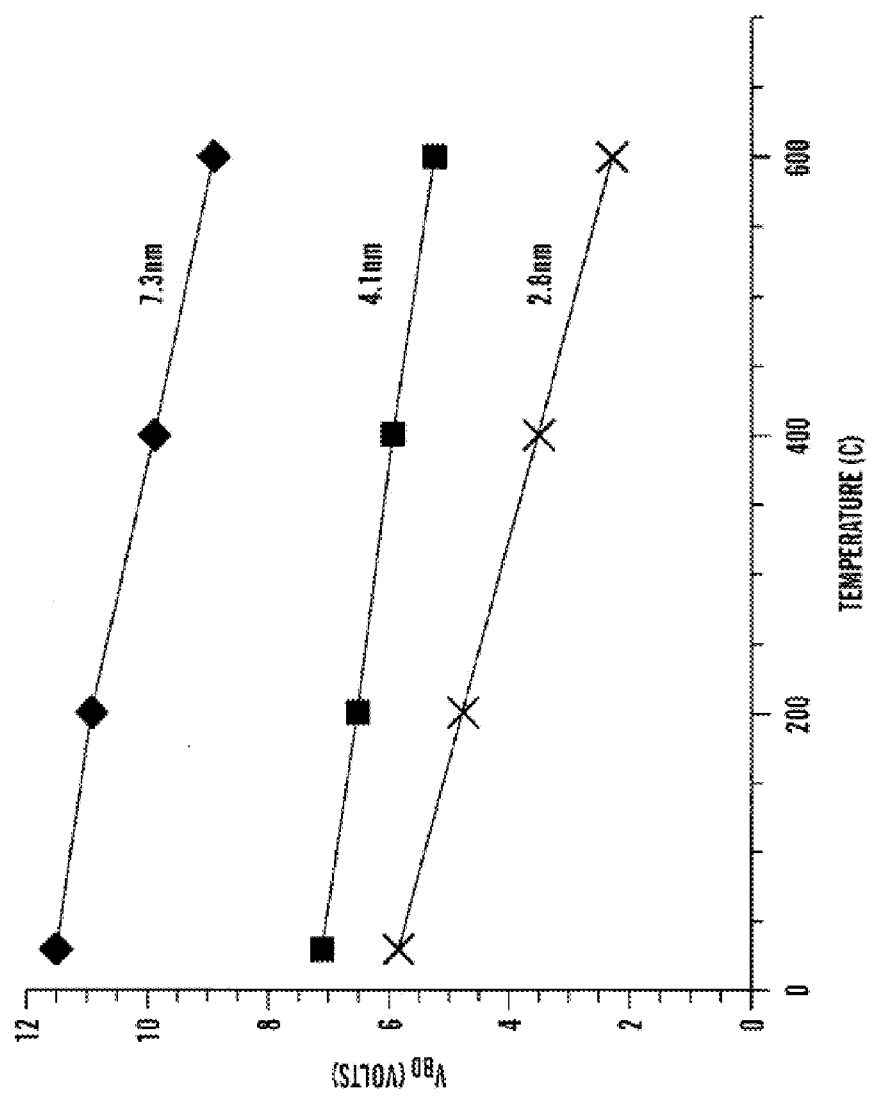
FIG. 1b is a diagram illustrating the effect temperature has on breakdown voltage for oxides of varying thicknesses.

The effect temperature has on oxide reliability can also be expressed in terms of a programming voltage ($V_{BD}$), where $V_{BD}$ is the voltage required to breakdown the antifuse dielectric layer. FIG. 1b illustrates the relationship between temperature and $V_{BD}$ for various oxide thicknesses (7.3 nm, 4.1 nm, and 2.8 nm). As applied to antifuses, this relationship can be utilized to reduce the voltage required to breakdown the antifuse dielectric layer by raising the temperature of the dielectric layer. For example, FIG. 1b illustrates how $V_{BD}$ can be significantly reduced by raising the temperature of the antifuse dielectric layer for a fixed $t_{BD}$ of 1 ms.

The present invention utilizes both the temperature/$t_{BD}$ and temperature/$V_{BD}$ relationships for thin oxides as illustrated in FIG. 1a and FIG. 1b, respectively, to provide improved antifuse structures and methods of programming thereof where either the programming voltage can be reduced substantially, the programming time can be reduced substantially, or a combination of both, while improving the reliability and cost effectiveness and minimizing the size of antifuse structures.

The invention will next be illustrated with reference to the figures in which the same numbers indicate the same elements in all figures. Such figures are intended to be illustrative, rather than limiting, and are included to facilitate the explanation of the structure and device of the present invention.

Figure 2A:
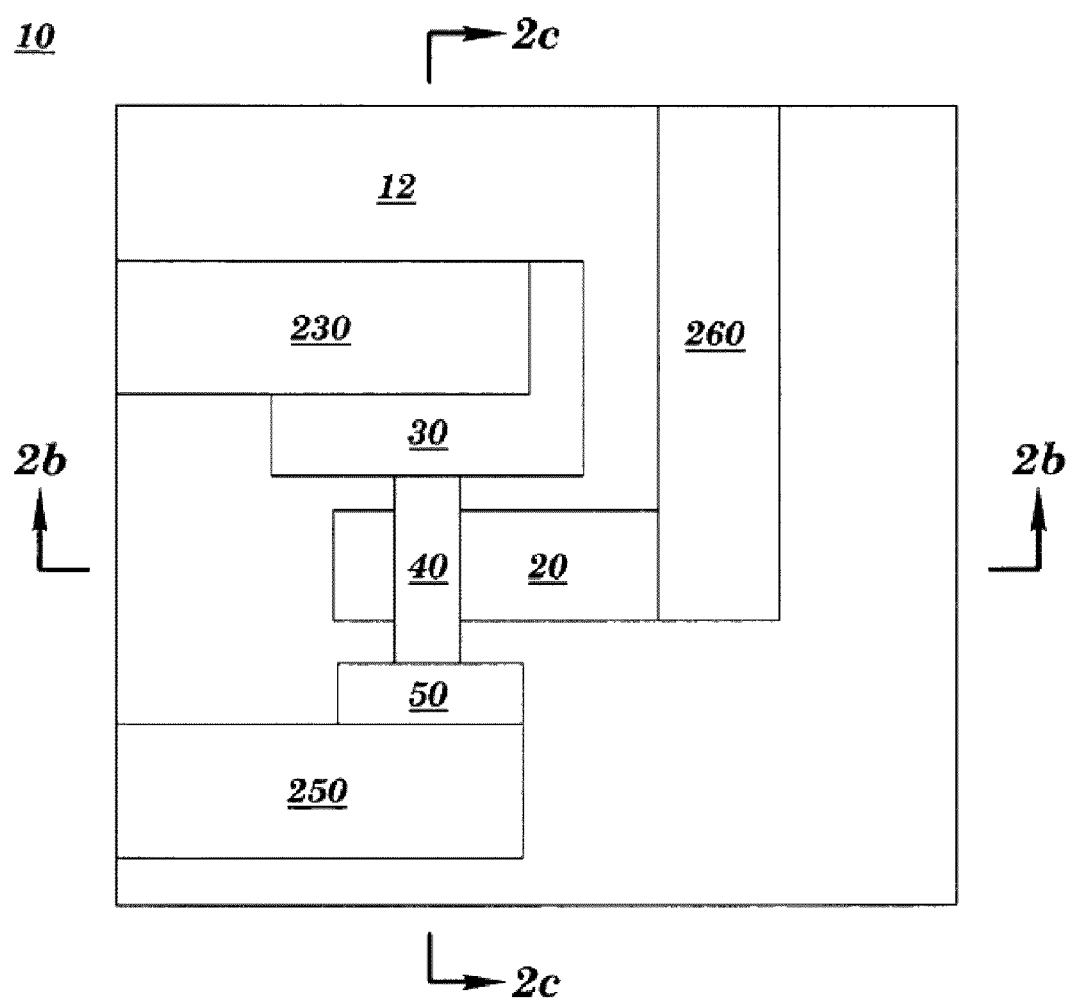
FIG. 2a illustrates a partial top-down view of a first embodiment of an antifuse structure according to the present invention.

FIG. 2a illustrates a partial top-down view of a first embodiment of an antifuse structure according to the present invention. Programmable circuit 10 includes an isolation layer 12 formed on a semiconductor substrate (not shown) and an antifuse structure formed by a lower conductor (not shown), upper conductor 40, and the portion of dielectric layer 20 formed between the lower and upper conductors. Anode 30 and cathode 50 are formed adjacent an insulating layer (not shown) and formed on isolation layer 12. Anode 30 and cathode 50 source/sink current through the upper conductor 40. Upper conductor 40 is also formed adjacent the insulating layer and formed partially on isolation layer 12 and partially on dielectric layer 20. In one example, upper conductor 40 has a width of approximately 60 nm to 120 nm and a length of approximately 300 nm to 1200 nm. Upper conductor 40 can be formed from any suitable conductive material such as doped and undoped polysilicon, doped and undoped silicided polysilicon, doped and undoped monocrystalline silicon, titanium nitride, tantalum nitride, metals including aluminum, copper and alloys thereof, and refractory metals including tungsten, titanium, tantalum and alloys thereof. Dielectric layer 20 is formed on the lower conductor and can be formed from any suitable dielectric capable of functioning as an antifuse dielectric such as silicon nitride (SiN), "gate oxide", i.e. silicon dioxide ($SiO_2$) formed by the gate oxide forming process, or silicon oxide-silicon oxynitride-silicon oxide (ONO). In one example, dielectric layer 20 has a thickness of approximately 1.0 nm to 2.0 nm, a width of approximately 60 nm to 120 nm and a length of approximately 1000 nm. The lower conductor can be formed by doping a region of the semiconductor substrate so that it can conduct charge. Alternatively, the lower conductor can be formed from a thin film transistor material such as polysilicon or any other conducting semiconductor material capable of supporting the formation of a gate dielectric.

Isolation layer 12 can be formed from any suitable insulating material capable of electrically isolating the antifuse structure from adjacent devices such as Shallow Trench Isolation ("STI"). The semiconductor substrate can be formed from any suitable semiconductor material such as bulk silicon, silicon-on-insulator ("SOI"), SiGe, GaAs, or the like. Anode 30 and cathode 50 can be formed from any suitable conductive material such as doped and undoped polysilicon, doped and undoped silicided polysilicon, doped and undoped monocrystalline silicon, titanium nitride, tantalum nitride, metals including aluminum, copper and alloys thereof and refractory metals including tungsten, titanium, tantalum and alloys thereof.

An electrical connection to anode 30 is formed by first conductor 230 and a first contact (not shown). An electrical connection to cathode 50 is formed by second conductor 250 and a second contact (not shown). An electrical connection to the lower conductor of the antifuse is formed by third conductor 260 and a third contact (not shown). The first, second, and third conductors and contacts, respectively, can be formed from any suitable conductive material such as doped and undoped polysilicon, doped and undoped silicided polysilicon, doped and undoped monocrystalline silicon, titanium nitride, tantalum nitride, metals including aluminum, copper and alloys thereof, and refractory metals including tungsten, titanium, tantalum and alloys thereof.

Figure 2B:
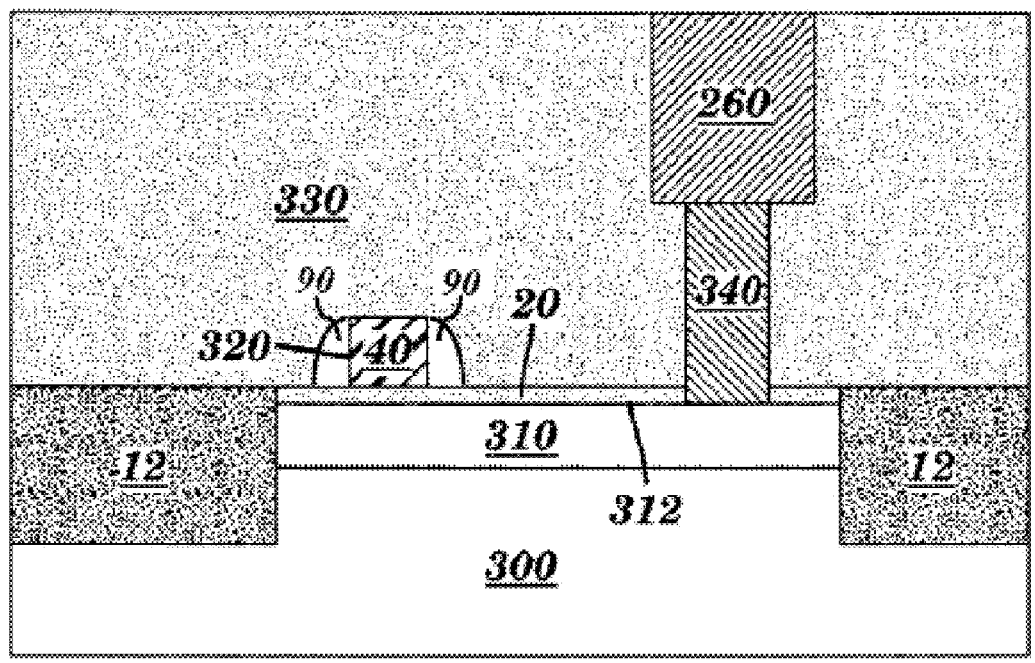
FIG. 2b illustrates a first partial cross-sectional view of a first embodiment of an antifuse structure according to the present invention.

FIG. 2b illustrates a partial cross-sectional view of the first embodiment of an antifuse structure according to the present invention along the plane indicated by the line labeled '2b' in FIG. 2a. Isolation layer 12 is formed on semiconductor substrate 300 and provides isolation as previously described. Optionally, isolation layer 12 may be recessed into substrate 300 as illustrated in FIG. 2b. Lower conductor 310, extending to top surface 312 of substrate 300, can be formed by doping a region of semiconductor substrate 300. In one example, lower conductor 310 has a width of approximately 60 nm to 120 nm and a length of approximately 1000 nm. Dielectric layer 20 is formed on the upper surface of lower conductor 310 and functions as the antifuse dielectric as previously described. Optional insulating spacers 90 can be formed on sidewalls 320 of upper conductor 40. Insulating layer 330 is formed on the upper surfaces of substrate 300, isolation layer 12 and dielectric layer 20. Insulating layer 330 electrically isolates the various electrical connections to the antifuse structure and can be formed from any suitable insulative material such as $SiO_2$, SiN, BPSG, or the like.

An electrical connection to the lower conductor 310 of the antifuse is formed by third conductor 260 and third contact 340. Third contact 340 extends downward from the bottom surface of third conductor 260, through openings in insulating layer 330 and dielectric layer 20, to an upper surface of lower conductor 310. The diameter (or width) of third contact 340 is less than the width of third conductor 260 and less than the width of dielectric layer 20. Third contact 340 can be formed from any suitable conductive material such as Tungsten. The electrical connection to lower conductor 310 formed by third conductor 260 and third contact 340 enables the lower conductor to be supplied with a voltage potential. This voltage potential facilitates the programming of the antifuse as will be discussed infra.

Figure 2C:
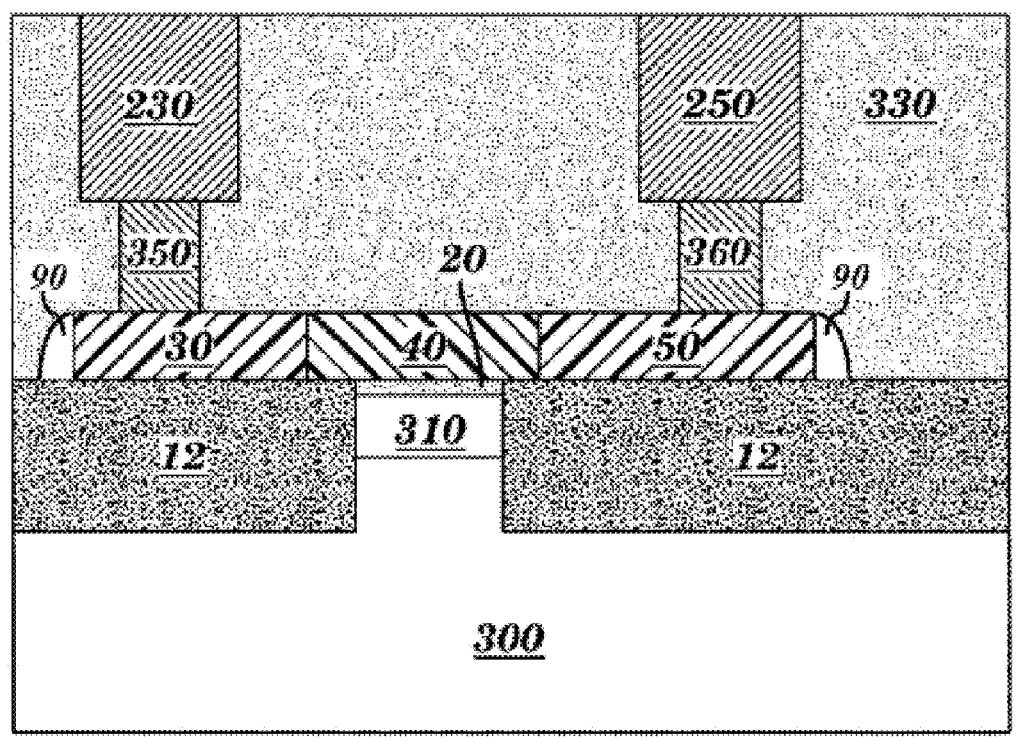
FIG. 2c illustrates a second partial cross-sectional view of a first embodiment of an antifuse structure according to the present invention.

FIG. 2c illustrates a partial cross-sectional view of the first embodiment of an antifuse structure according to the present invention along the plane indicated by the line labeled '2c' in FIG. 2a. Insulating layer 330 electrically isolates first conductor 230 and first contact 350 from second conductor 250 and second contact 360. Dielectric layer 20 is formed on the upper surface of lower conductor 310 and functions as the antifuse dielectric as previously described.

An electrical connection to anode 30 is formed by first conductor 230 and first contact 350. First contact 350 extends downward from the bottom surface of first conductor 230, through an opening in insulating layer 330, to an upper surface of anode 30. The diameter (or width) of first contact 350 is less than the width of first conductor 230 and less than the width of anode 30. An electrical connection to cathode 50 is formed by second conductor 250 and second contact 360. Second contact 360 extends downward from the bottom surface of second conductor 250, through an opening in insulating layer 330, to an upper surface of cathode 50. The diameter (or width) of second contact 360 is less than the width of second conductor 250 and less than the width of cathode 50. First contact 350 and second contact 360 can be formed from any suitable conductive material such as Tungsten.

The electrical connection to anode 30 formed by first conductor 230 and first contact 350 and the electrical connection to cathode 50 formed by second conductor 250 and second contact 360 enables upper conductor 40 to be supplied with two voltage potentials. A power supply for supplying two voltage potentials as known in the art can be employed for such purposes. These voltage potentials both facilitate the programming of the antifuse and also induce a current I to flow in upper conductor 40 that is proportional to the voltage difference applied across the anode and cathode. When a current I flows through upper conductor 40, the upper conductor generates Joule heating. Because upper conductor 40 is in direct contact with dielectric layer 20, the dielectric layer is heated directly, thus substantially improving the programming efficiency of the antifuse structure. Thus, upper conductor 40 functions as both a conventional antifuse conductor and as a heating element.

Figure 3A:
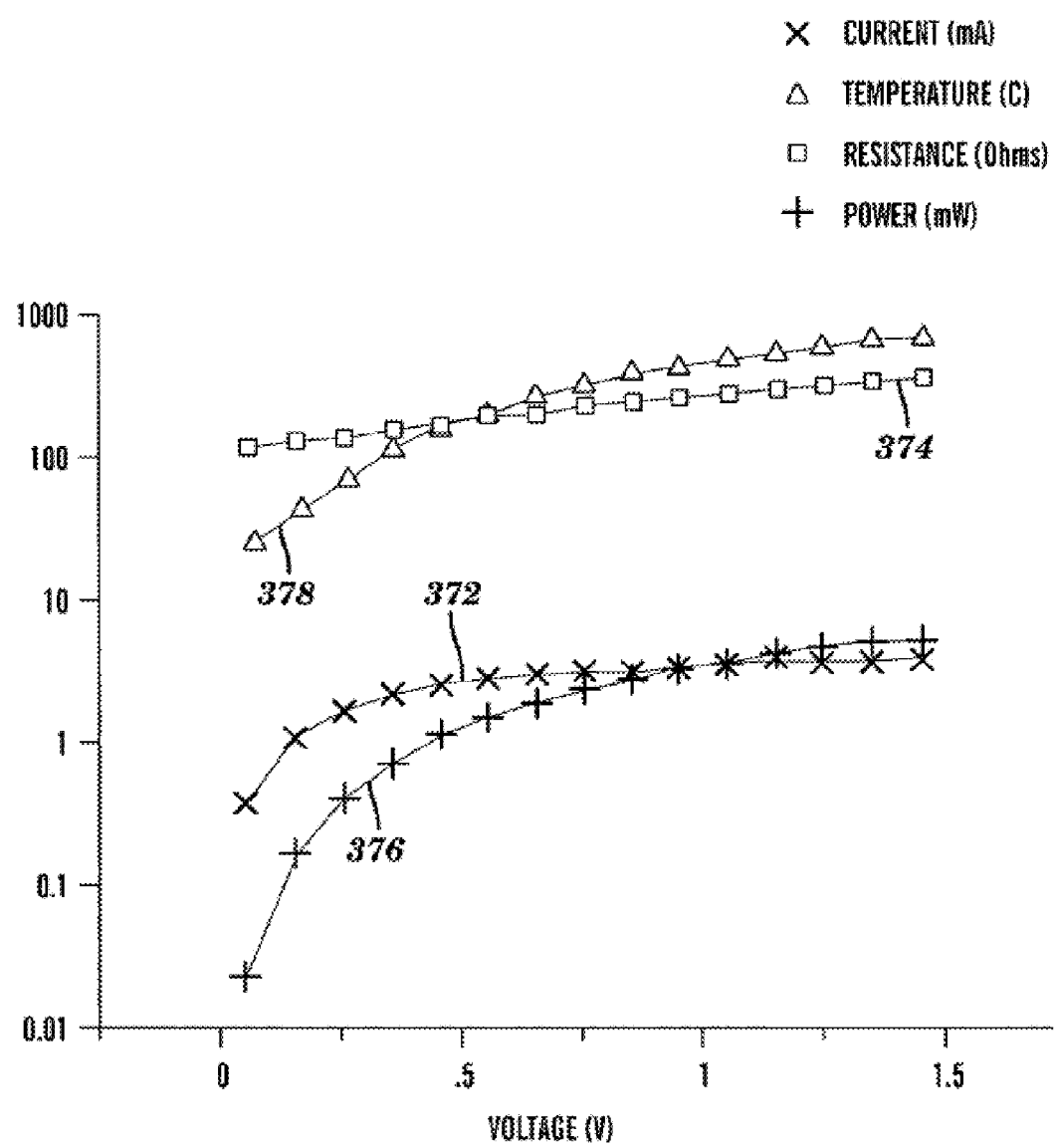
FIG. 3a is a diagram illustrating the electrical characteristics of a cobalt silicided polysilicon antifuse conductor of the present invention.

FIG. 3a illustrates the electrical characteristics of one example of upper conductor 40 where the conductor comprises a layer of cobalt silicide formed on a layer of polysilicon. The cobalt silicided polysilicon conductor has a thickness of approximately 1800 Å (300 Å of cobalt silicide formed on 1500 Å of polysilicon), a width of approximately 90 mm, and a length of approximately 1200 nm. FIG. 3a illustrates the basic electrical parameters of the cobalt silicided polysilicon conductor such as: current 372 (measured in mA), resistance 374 (measured in Ohms), power 376 (measured in mW), and temperature 378 (measured in degrees C.).

Figure 3B:
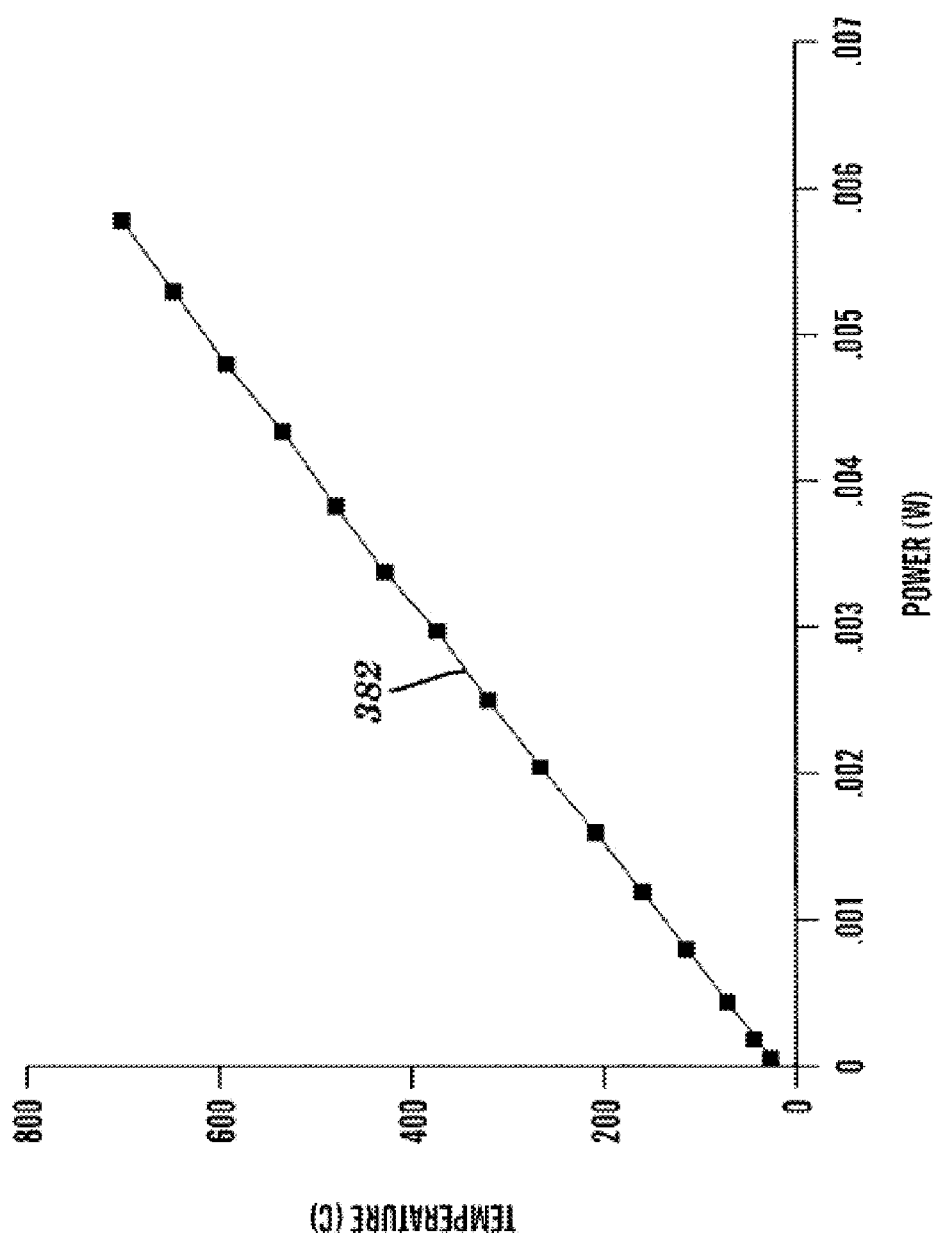
FIG. 3b is a diagram illustrating the heating efficiency of a cobalt silicided polysilicon antifuse conductor of the present invention.

FIG. 3b illustrates the heating efficiency of the exemplary cobalt silicided polysilicon conductor where heating efficiency is measured in degrees C./Watt. Curve 382 represents the heating efficiency of the exemplary conductor. The y-axis represents the temperature of the exemplary conductor and the x-axis represents input power to the conductor. The input power supplied to the exemplary conductor is proportional to the voltage applied across the conductor and the amount of current flowing through the conductor as previously described.

Figure 3C:
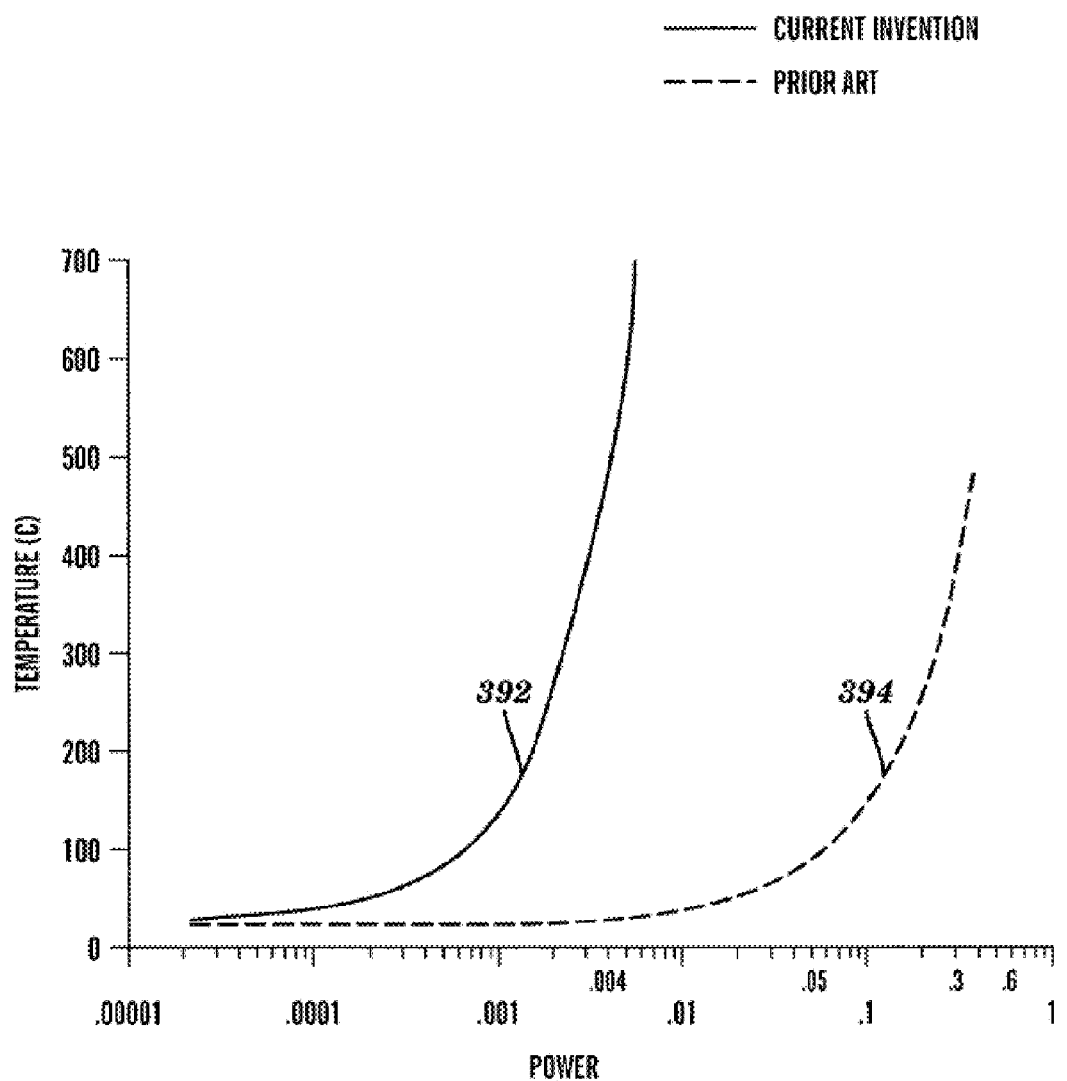
FIG. 3c is a diagram illustrating a comparison of the heating efficiencies of a cobalt silicided polysilicon conductor of the present invention and the prior art.

FIG. 3c illustrates a comparison of the heating efficiencies of the exemplary cobalt silicided polysilicon conductor of the present invention and the prior art (e.g. the '530 patent). Curve 392 represents the heating efficiency of the exemplary conductor of the present invention and curve 394 represents the heating efficiency of the prior art. The y-axis represents the temperature of the respective heating elements and the x-axis represents input power to the respective heating elements. As is apparent from FIG. 3c, the integrated heating element/upper conductor of the present invention provides more than a 100× improvement in heating efficiency as compared to the prior art. In other words, the integrated heating element/upper conductor of the present invention can provide the same heating capability as the prior art while consuming at least 100× less the amount of power.

However, in reality, the integrated antifuse structure of the present invention most likely would provide more than a 1000× efficiency improvement as compared to the prior art. This is so because the curves illustrated in FIG. 3c represent the heating efficiency of the respective heating elements, not of the antifuse dielectric itself. It is the temperature of the antifuse dielectric layer that must be increased to improve antifuse programming efficiency according to the relationships illustrated in FIG. 1a and FIG. 1b. Because the integrated heating element/upper conductor of the present invention is in direct contact with the antifuse dielectric layer as previously described, the surface of the dielectric layer is approximately at the same temperature as the upper conductor. Therefore, the dielectric layer is directly heated and very little heat loss occurs. However, the non-integrated, external heating element solution of the prior art generates heat energy that must pass through a thick insulating layer before reaching the antifuse dielectric layer. Significant heat loss will occur through such a path, and thus require additional input power in order to adequately raise the temperature of the antifuse dielectric. This is not the case with the integrated antifuse structure of the present invention.

To program the antifuse of the first embodiment, sufficient voltage differential for a sufficient duration of time must be applied to upper conductor 40 and lower conductor 310 to cause a breakdown in dielectric layer 20, thus shorting the upper conductor to the lower conductor. A voltage difference can be applied across dielectric layer 20 by applying a first potential ($V_{LP}$) to lower conductor 310 (via third conductor 260) and applying a different potential at upper conductor 40. A potential is applied to upper conductor 40 by applying a second potential ($V_A$) to first conductor 230 and applying a third potential ($V_C$) at third conductor 250. The voltage at the portion of the upper conductor that overlaps the lower conductor is: ($a \times V_A + (1-a) \times V_C$) where a is a variable number having a range between 0 and 1 depending on the exact geometry and exact location within the overlap area. For a given thickness of silicon dioxide (or alternative dielectric) and a given temperature generated by the voltage difference $|V_A - V_C|$, there exists a breakdown voltage $V_{BD}$ for a predefined breakdown time $t_{BD}$ (e.g. 1 ms). So long as the absolute potential difference across the overlapping area, represented by: $|(a \times V_A + (1-a) \times V_C) - V_{LP}|$, exceeds $V_{BD}$, the dielectric will breakdown within the time $t_{BD}$ from the beginning of the biasing or from the time the temperature increases due to heating stabilization. Numerous combinations of voltage potentials can be applied to facilitate programming of the antifuse structure of the present invention and are within the scope of the invention. For example, lower conductor 310 may be biased at ground while upper conductor 40 is biased at some positive or negative potential. Alternately, lower conductor 310 may be biased at a negative potential while upper conductor 40 is biased at a potential that is either more or less negative than the potential applied to the lower conductor. The only requirement is that there be a potential difference between the upper and lower conductors.

Programming of the antifuse can be accelerated by raising the temperature of dielectric layer 20 as illustrated in FIG. 1a and FIG. 1b. To raise the temperature of dielectric layer 20, a current I is passed through upper conductor 40, thus causing Joule heating. The current passing through upper conductor 40 is generated by applying a voltage difference across anode 30 and cathode 50 as previously described. This voltage difference can be generated by applying VA to anode 30 via first conductor 230 and applying VC to cathode 50 via second conductor 250 where $V_A$ and $V_C$ are not equal (i.e. $V_A \neq V_C$). The amount of current I flowing through upper conductor 40 is proportional to the magnitude of the difference between VA and VC (i.e. $I \propto [V_A - V_C]$). Joule heating occurs when current I flows in either direction through upper conductor 40, and thus, the polarities of $V_A$ and $V_C$ are irrelevant. In one example, the current flowing through upper conductor 40 can range from approximately 1 mA to 10 mA and the temperature of dielectric layer 20 can range from approximately 200 C to 800 C.

When current is passed through upper conductor 40, the conductor functions as both a conventional antifuse upper conductor and also as a heating element that supplies direct heat energy to dielectric layer 20. This integrated functionality of upper conductor 40 is a substantial divergence from conventional antifuse structures where the upper conductor functions only as a voltage node for programming the antifuse and has no heat generation capability. Additionally, conventional antifuse heating elements are not intentionally part of the antifuse structure itself and not in direct contact with the dielectric layer of the antifuse, but instead, are isolated from the antifuse structure by a thick insulating layer. In the present invention, upper conductor 40 functions both as a voltage node for programming the antifuse and as a heat generator for directly heating dielectric layer 20. The structure of the present invention differs from conventional antifuse structures in that the present structure integrates the heating element and the upper conductor into a single element that is part of the antifuse structure itself. The integrated element is in direct contact with the dielectric layer of the antifuse, thus providing direct heating to the dielectric layer which vastly improves the transfer of heat energy to the antifuse dielectric layer as compared to conventional techniques. By improving the heat energy transfer characteristics of the antifuse structure, the antifuse may be programmed more efficiently (e.g. reduced $t_{BD}$, reduced $V_{BD}$, or a combination of both).

Figure 4A:
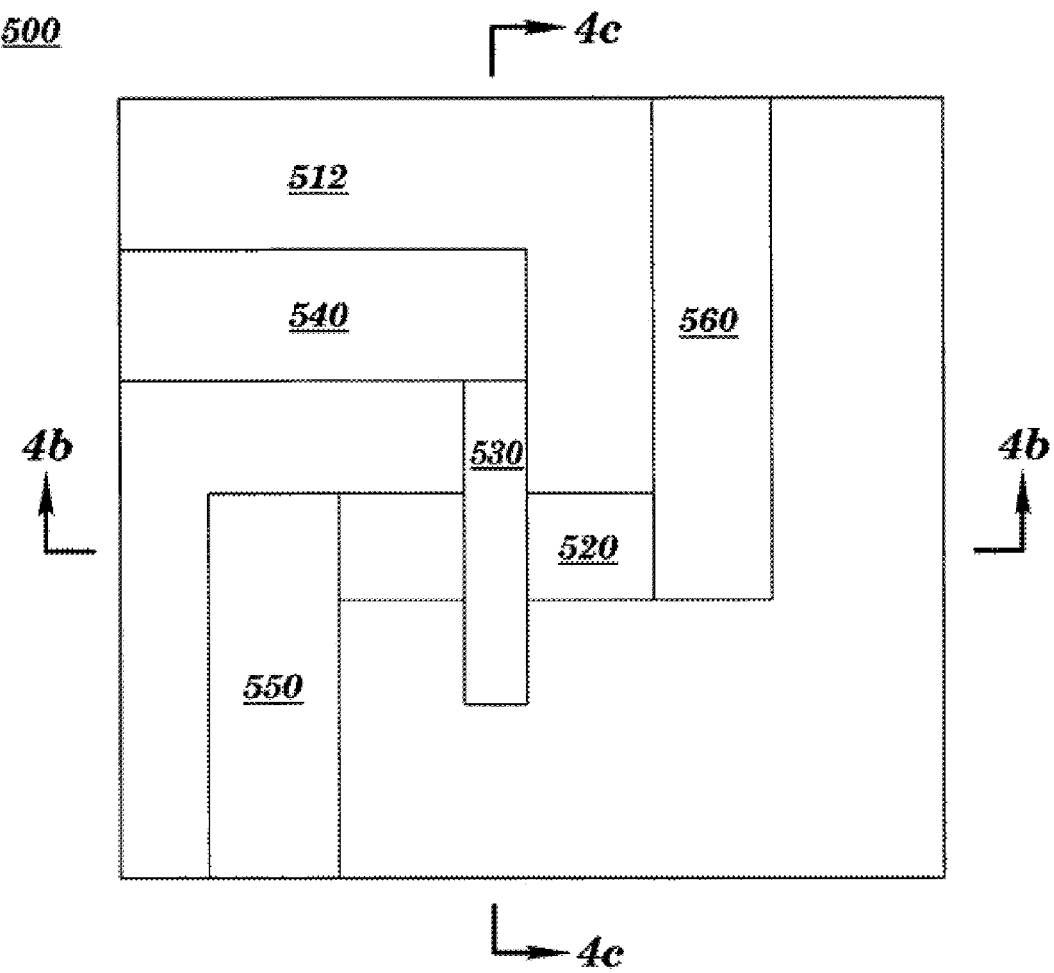
FIG. 4a illustrates a partial top-down view of a second embodiment of an antifuse structure according to the present invention.

FIG. 4a illustrates a partial top-down view of a second embodiment of an antifuse structure according to the present invention. Programmable circuit 500 includes an isolation layer 512 formed on a semiconductor substrate (not shown) and an antifuse structure formed by a lower conductor (not shown), upper conductor 530, and the portion of dielectric layer 520 formed between the lower and upper conductors. Upper conductor 530 is formed adjacent an insulating layer (not shown) and formed partially on isolation layer 512 and partially on dielectric layer 520. Upper conductor 530 can be formed from any suitable conductive material such as doped and undoped polysilicon, doped and undoped silicided polysilicon, doped and undoped monocrystalline silicon, titanium nitride, tantalum nitride, metals including aluminum, copper and alloys thereof, and refractory metals including tungsten, titanium, tantalum and alloys thereof. Dielectric layer 520 is formed on the lower conductor and can be formed from any suitable dielectric capable of functioning as an antifuse dielectric such as SiN, gate oxide, or ONO. The lower conductor can be formed by doping a region of the semiconductor substrate so that it can conduct charge. Alternatively, the lower conductor can be formed from a thin film transistor material such as polysilicon or any other conducting semiconductor material capable of supporting the formation of gate dielectric.

Isolation layer 512 can be formed from any suitable insulating material capable of electrically isolating the antifuse structure from adjacent devices such as STI. The semiconductor substrate can be formed from any suitable semiconductor material such as bulk silicon, SOI, SiGe, GaAs, or the like.

An electrical connection to upper conductor 530 is formed by first conductor 540 and a first contact (not shown). An electrical connection to a first portion of the lower conductor of the antifuse is formed by second conductor 550 and a second contact (not shown). An electrical connection to a second portion of the lower conductor of the antifuse is formed by third conductor 560 and a third contact (not shown). The first, second, and third conductors and contacts, respectively, can be formed from any suitable conductive material such as doped and undoped polysilicon, doped and undoped silicided polysilicon, doped and undoped monocrystalline silicon, titanium nitride, tantalum nitride, metals including aluminum, copper and alloys thereof, and refractory metals including tungsten, titanium, tantalum and alloys thereof.

Figure 4B:
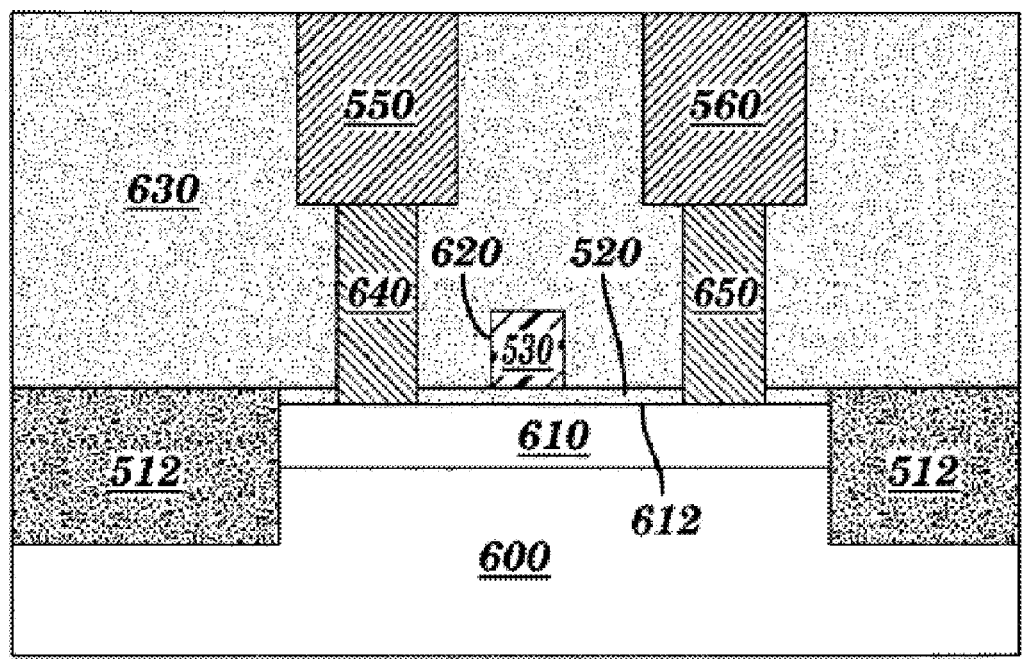
FIG. 4b illustrates a first partial cross-sectional view of a second embodiment of an antifuse structure according to the present invention.

FIG. 4b illustrates a partial cross-sectional view of the second embodiment of an antifuse structure according to the present invention along the plane indicated by the line labeled '4b' in FIG. 4a. Isolation layer 512 is formed on semiconductor substrate 600 and provides isolation as previously described. Optionally, isolation layer 512 may be recessed into substrate 600 as illustrated in FIG. 4b. Lower conductor 610, extending to top surface 612 of substrate 600, can be formed by doping a region of semiconductor substrate 600. Dielectric layer 520 is formed on the upper surface of lower conductor 610 and functions as the antifuse dielectric as previously described. Optional insulating spacers (not shown) can be formed on sidewalls 620 of upper conductor 530. Insulating layer 630 is formed on the upper surfaces of substrate 600, isolation layer 512 and dielectric layer 520. Insulating layer 630 electrically isolates second conductor 550 and second contact 640 from third conductor 560 and third contact 650 and can be formed from any suitable insulative material such as $SiO_2$, SiN, BPSG, or the like.

An electrical connection to a first portion of lower conductor 610 is formed by second conductor 550 and second contact 640. Second contact 640 extends downward from the bottom surface of second conductor 550, through openings in insulating layer 630 and dielectric layer 520, to an upper surface of a first portion of lower conductor 610. An electrical connection to a second portion of lower conductor 610 is formed by third conductor 560 and third contact 650. Third contact 650 extends downward from the bottom surface of third conductor 560, through openings in insulating layer 630 and dielectric layer 520, to an upper surface of a second portion of lower conductor 610. Second contact 640 and third contact 650 can be formed from any suitable conductive material such as Tungsten.

The electrical connection to a first portion of lower conductor 610 formed by second conductor 550 and second contact 640 and the electrical connection to a second portion of lower conductor 610 formed by third conductor 560 and third contact 650 enable lower conductor 610 to be supplied with a first voltage potential ($V_{LP1}$) and a second voltage potential ($V_{LP2}$), respectively. These voltage potentials both facilitate the programming of the antifuse and also induce a current I to flow in lower conductor 610 that is proportional to the voltage difference applied across it (i.e. $I \propto [V_{LP1}-V_{LP2}]$). When a current I flows through lower conductor 610, the lower conductor generates Joule heating in the same way that upper conductor 40 of the first embodiment generates heat energy as described supra. Preferably, semiconductor substrate 600 is of the SOI kind so that heat energy generated by lower conductor 610 is not dissipated into the semiconductor substrate, but instead is transferred to the dielectric layer 520. The insulative nature of SOI substrates minimizes heat loss that would normally occur in a bulk silicon substrate by trapping heat energy between the antifuse dielectric layer and the buried oxide layer of the SOI substrate. Thus, the programming efficiency of the antifuse structure of the second embodiment can be improved in the same manner as it was improved in the first embodiment. The difference between the second and first embodiments is that in the second embodiment, lower conductor 610 generates joule heating whereas upper conductor 40 generates joule heating in the first embodiment.

Figure 4C:
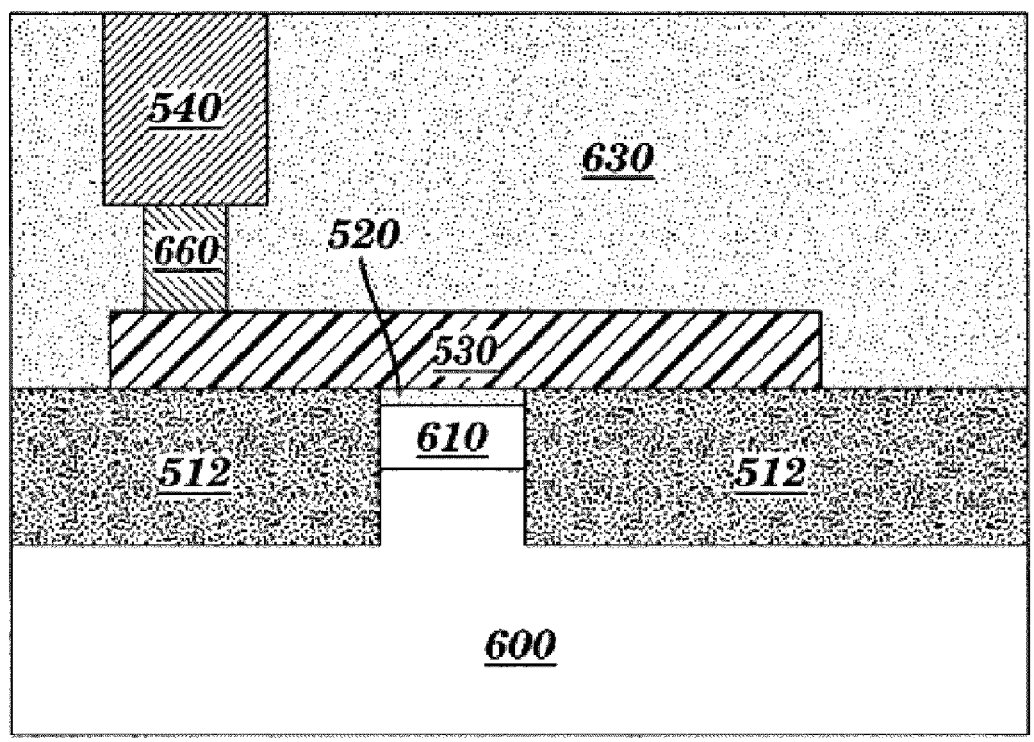
FIG. 4c illustrates a second partial cross-sectional view of a second embodiment of an antifuse structure according to the present invention.

FIG. 4c illustrates a partial cross-sectional view of the second embodiment of an antifuse structure according to the present invention along the plane indicated by the line labeled '4c' in FIG. 4a. Insulating layer 630 electrically isolates the various electrical connections to the antifuse structure. An electrical connection to upper conductor 530 of the antifuse is formed by first conductor 540 and first contact 660. First contact 660 extends downward from the bottom surface of first conductor 540, through an opening in insulating layer 630, to an upper surface of upper conductor 530. First contact 660 can be formed from any suitable conductive material such as Tungsten. The electrical connection to upper conductor 530 formed by first conductor 540 and first contact 660 enables the upper conductor to be supplied with a third voltage potential. This voltage potential facilitates the programming of the antifuse of the second embodiment just as the voltage potential supplied to lower conductor 310 of the first embodiment facilitates programming of the antifuse of the first embodiment.

The antifuse of the second embodiment is programmed in a similar way as the antifuse of the first embodiment. Sufficient voltage differential for a sufficient duration of time must be applied across upper conductor 530 and lower conductor 610 to cause a breakdown in dielectric layer 520, thus shorting the upper conductor to the lower conductor. However, in the second embodiment, programming of the antifuse can be accelerated by raising the temperature of dielectric layer 520 by passing a current I through lower conductor 610, thus causing Joule heating. The current I is generated much the same way as it is generated in the first embodiment except that it flows through the lower conductor instead of the upper conductor to create heat energy. In one example, since very heavily doped silicon (~$10^{21}$/cm$^3$) has a resistivity of ~$10^{-4}$ Ohm-cm, a lower conductor with length 400 nm, width 100 nm, and depth 100 nm above the SOI layer would have a resistance of about 40 Ohms and would generate heat at a rate of about 5 mW under 0.5 V bias conditions. As is the case with upper conductor 40 of the first embodiment, when current is passed through lower conductor 610, the conductor functions as both a conventional antifuse lower conductor and also as a heating element that supplies direct heat energy to dielectric layer 520.

Figure 5A:
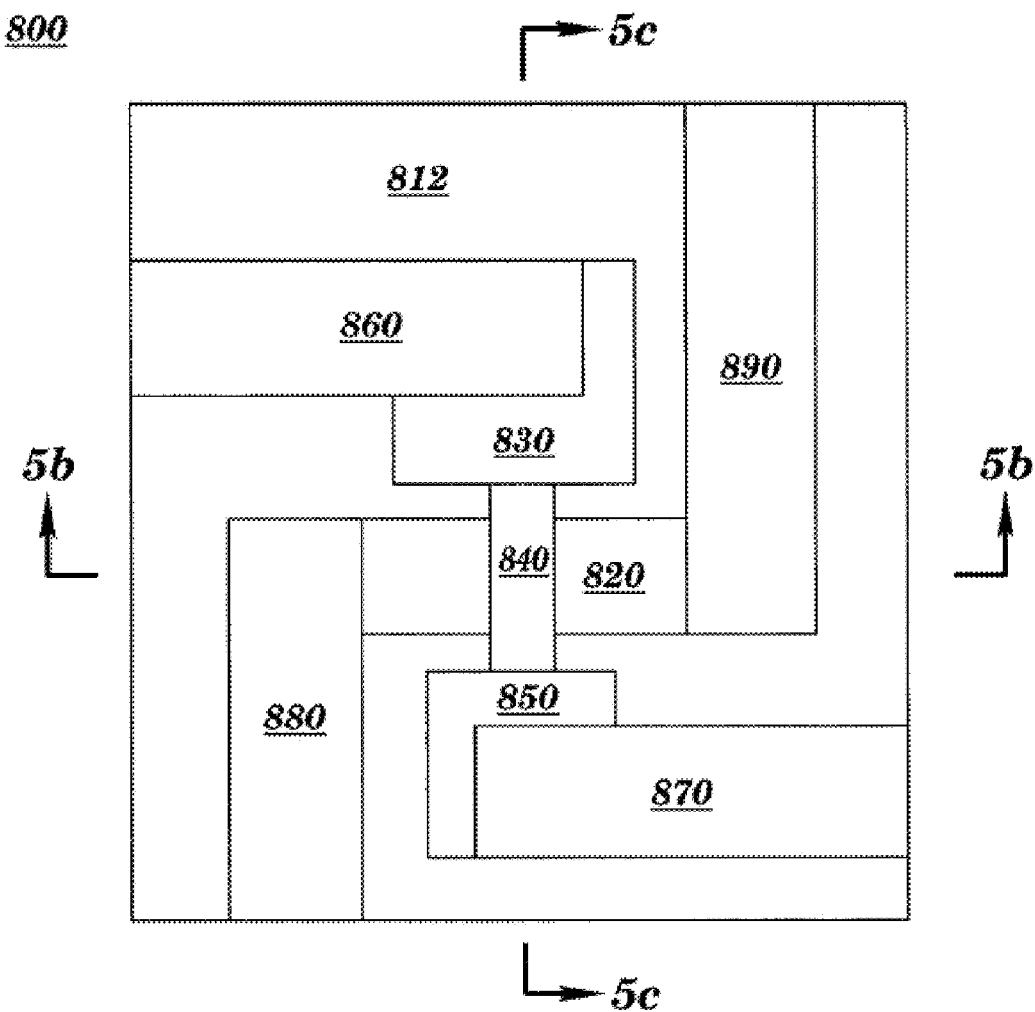
FIG. 5a illustrates a partial top-down view of a third embodiment of an antifuse structure according to the present invention.

FIG. 5a illustrates a partial top-down view of a third embodiment of an antifuse structure according to the present invention. Programmable circuit 800 includes an isolation layer 812 formed on a semiconductor substrate (not shown) and an antifuse structure formed by a lower conductor (not shown), upper conductor 840, and the portion of dielectric layer 820 formed between the lower and upper conductors. Anode 830 and cathode 850 are formed adjacent an insulating layer (not shown) and formed on isolation layer 812. Anode 830 and cathode 850 source/sink current through upper conductor 840. Upper conductor 840 is also formed adjacent the insulating layer and formed partially on isolation layer 812 and partially on dielectric layer 820. Upper conductor 840 can be formed from any suitable conductive material such as doped and undoped polysilicon, doped and undoped silicided polysilicon, doped and undoped monocrystalline silicon, titanium nitride, tantalum nitride, metals including aluminum, copper and alloys thereof, and refractory metals including tungsten, titanium, tantalum and alloys thereof. Dielectric layer 820 is formed on the lower conductor and can be formed from any suitable dielectric capable of functioning as an antifuse dielectric such as gate oxide. The lower conductor can be formed by doping a region of the semiconductor substrate so that it can conduct charge. Alternatively, the lower conductor can be formed from a thin film transistor material such as polysilicon or any other conducting semiconductor material capable of supporting the formation of gate dielectric.

Isolation layer 812 can be formed from any suitable insulating material capable of electrically isolating the antifuse structure from adjacent devices such as STI. The semiconductor substrate can be formed from any suitable semiconductor material such as bulk silicon, SOI, SiGe, GaAs, or the like.

An electrical connection to anode 830 is formed by first conductor 860 and a first contact (not shown) and an electrical connection to cathode 850 is formed by second conductor 870 and a second contact (not shown). An electrical connection to a first portion of the lower conductor of the antifuse is formed by third conductor 880 and a third contact (not shown) and an electrical connection to a second portion of the lower conductor is formed by fourth conductor 890 and a fourth contact (not shown). The first, second, third, and fourth conductors and contacts, respectively, can be formed from any suitable conductive material such as doped and undoped polysilicon, doped and undoped silicided polysilicon, doped and undoped monocrystalline silicon, titanium nitride, tantalum nitride, metals including aluminum, copper and alloys thereof, and refractory metals including tungsten, titanium, tantalum and alloys thereof.

Figure 5B:
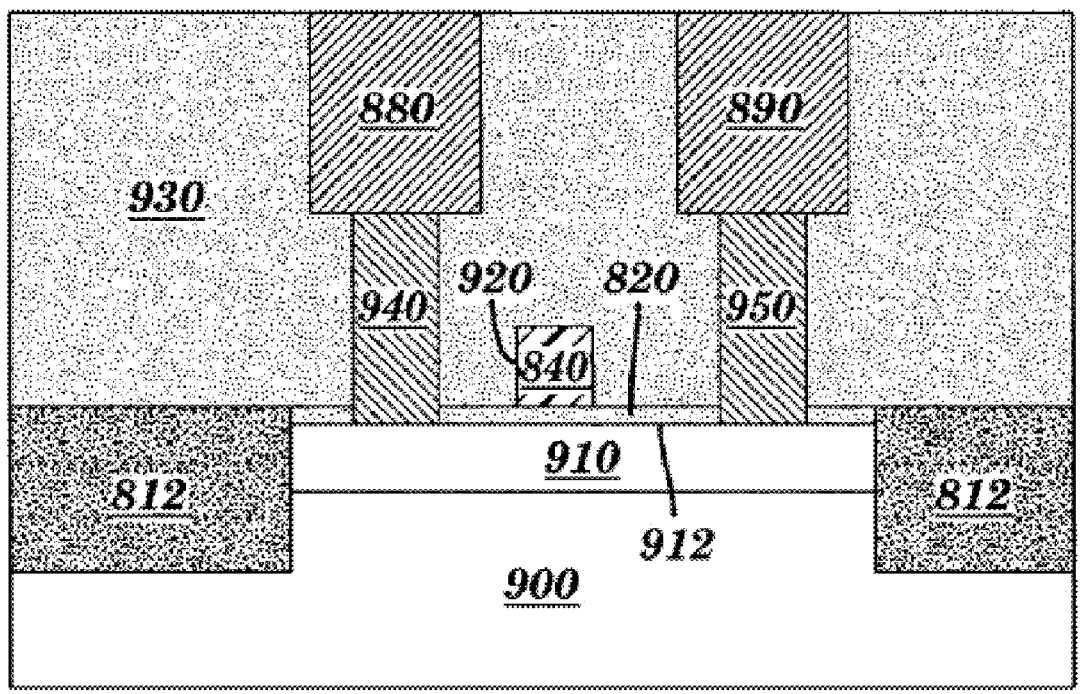
FIG. 5b illustrates a first partial cross-sectional view of a third embodiment of an antifuse structure according to the present invention.

FIG. 5b illustrates a partial cross-sectional view of a third embodiment of an antifuse structure according to the present invention along the plane indicated by the line labeled '5b' in FIG. 5a. Isolation layer 812 is formed on semiconductor substrate 900 and provides isolation as previously described. Optionally, isolation layer 812 may be recessed into substrate 900 as illustrated in FIG. 5b. Lower conductor 910, extending to top surface 912 of substrate 900, can be formed by doping a region of semiconductor substrate 900. Dielectric layer 820 is formed on the upper surface of lower conductor 910 and functions as the antifuse dielectric as previously described. Optional insulating spacers (not shown) can be formed on sidewalls 920 of upper conductor 840. Insulating layer 930 is formed on the upper surfaces of substrate 900, isolation layer 812 and dielectric layer 820. Insulating layer 930 electrically isolates third conductor 880 and third contact 940 from fourth conductor 890 and fourth contact 950 and can be formed from any suitable insulative material such as SiO$_2$, SiN, BPSG, or the like.

An electrical connection to a first portion of lower conductor 910 is formed by third conductor 880 and third contact 940. Third contact 940 extends downward from the bottom surface of third conductor 880, through openings in insulating layer 930 and dielectric layer 820, to an upper surface of a first portion of lower conductor 910. An electrical connection to a second portion of lower conductor 910 is formed by fourth conductor 890 and fourth contact 950. Fourth contact 950 extends downward from the bottom surface of fourth conductor 890, through openings in insulating layer 630 and dielectric layer 820, to an upper surface of a second portion of lower conductor 910. Third contact 940 and fourth contact 950 can be formed from any suitable conductive material such as Tungsten.

The electrical connection to a first portion of lower conductor 910 formed by third conductor 880 and third contact 940 and the electrical connection to a second portion of lower conductor 910 formed by fourth conductor 890 and fourth contact 950 enable lower conductor 910 to be supplied with a first voltage potential ($V_{LP1}$) and a second voltage potential ($V_{LP2}$), respectively. These voltage potentials both facilitate the programming of the antifuse and also induce a current IL to flow in lower conductor 910 that is proportional to the voltage difference applied across it (i.e. $I_L \propto [V_{LP1} - V_{LP2}]$). When current $I_L$ flows through lower conductor 910, the lower conductor generates Joule heating in the same way that lower conductor 610 of the second embodiment generates heat energy as described supra. Preferably, semiconductor substrate 900 is of the SOI kind so that heat energy generated by lower conductor 910 is not dissipated into the semiconductor substrate, but instead is transferred to the dielectric layer 820 as described supra. Thus, the programming efficiency of the antifuse structure of the third embodiment can be improved in the same manner as it was improved in both the first and second embodiments. The second and third embodiments are similar in that both lower conductor 610 and lower conductor 910 generate joule heating.

Figure 5C:
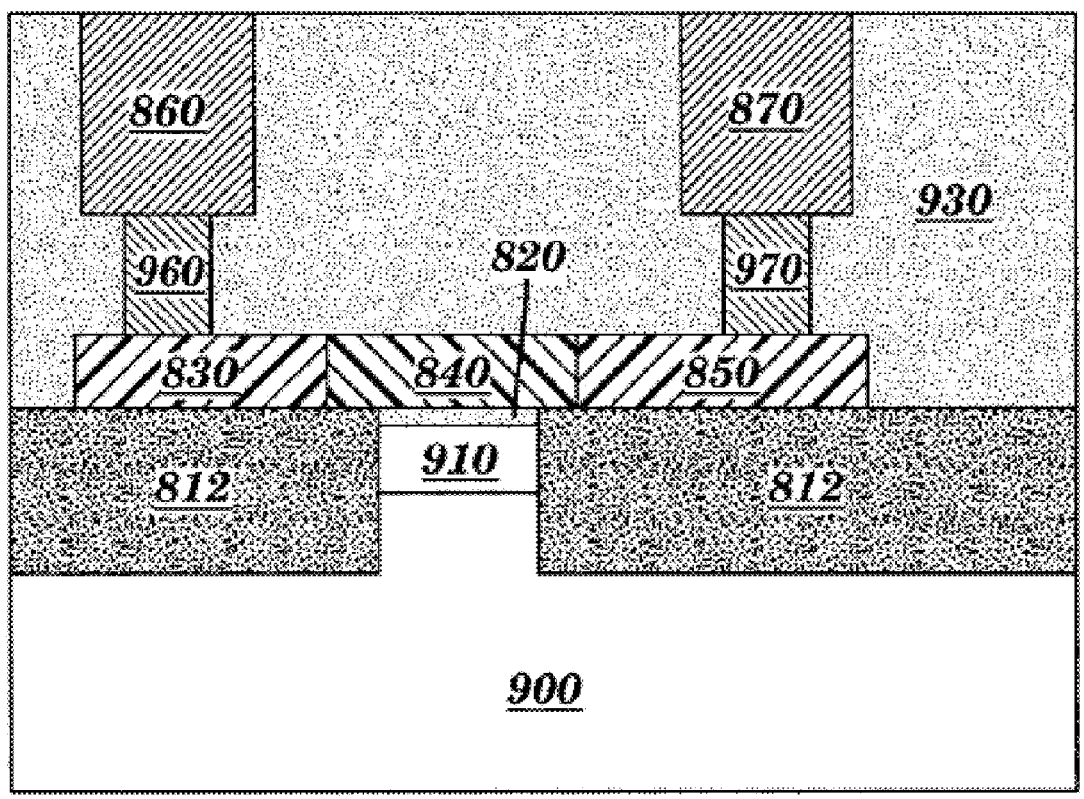
FIG. 5c illustrates a second partial cross-sectional view of a third embodiment of an antifuse structure according to the present invention.

FIG. 5c illustrates a partial cross-sectional view of the third embodiment of an antifuse structure according to the present invention along the plane indicated by the line labeled '5c' in FIG. 5a. Insulating layer 930 electrically isolates first conductor 860 and first contact 960 from second conductor 870 and second contact 970. Dielectric layer 820 is formed on the upper surface of lower conductor 910 and functions as the antifuse dielectric as previously described.

An electrical connection to anode 830 is formed by first conductor 860 and first contact 960. First contact 960 extends downward from the bottom surface of first conductor 860, through an opening in insulating layer 930, to an upper surface of anode 830. An electrical connection to cathode 850 is formed by second conductor 870 and second contact 970. Second contact 970 extends downward from the bottom surface of second conductor 870, through an opening in insulating layer 930, to an upper surface of cathode 850. First contact 960 and second contact 970 can be formed from any suitable conductive material such as Tungsten.

The electrical connection to anode 830 formed by first conductor 860 and first contact 960 and the electrical connection to cathode 850 formed by second conductor 870 and second contact 970 enable upper conductor 840 to be supplied with a third voltage potential ($V_A$) and a fourth voltage potential ($V_C$), respectively. These voltage potentials both facilitate the programming of the antifuse and also induce a current IU to flow in upper conductor 840 that is proportional to the voltage difference applied across the conductor (i.e. $IU \propto [V_A - V_C]$). When current IU flows through upper conductor 840, the upper conductor generates Joule heating in the same way that upper conductor 40 of the first embodiment generates heat energy as described supra.

The antifuse of the third embodiment is programmed in a similar way as the antifuses of the first and second embodiments. Sufficient voltage differential for a sufficient duration of time must be applied across upper conductor 840 and lower conductor 910 to cause a breakdown in dielectric layer 820, thus shorting the upper conductor to the lower conductor. However, in the third embodiment, programming of the antifuse can be accelerated by raising the temperature of dielectric layer 820 by passing current through both upper conductor 840 and lower conductor 910, thus causing Joule heating in both conductors. Current $I_U$ flowing in upper conductor 840 is generated in the same way that it is generated in the first embodiment, by applying a voltage potential difference across the upper conductor. Current $I_L$ flowing in lower conductor 910 is generated in the same way that it is generated in the second embodiment, by applying a voltage potential difference across the lower conductor. When current is passed through both upper conductor 840 and lower conductor 610, they each function as both a conventional antifuse conductor and also as a heating element that supplies direct heat energy to dielectric layer 820. Thus, the third embodiment of the present invention provides direct heating to dielectric layer 20 from both upper conductor 840 and lower conductor 910.

Joule's law gives the amount of heat Q liberated by current I flowing through a resistor with resistance R for a time t. $Q=I^2Rt$, where $R=\rho \times L/A$ and:
R=resistance (in ohms)
$\rho$=resistivity (in ohm-meters)
L=length of resistor (in meters)
A=cross-sectional area (in meters$^2$)

Thus, for a fixed material type, Joule heat can be increased by increasing the length or reducing the cross-sectional area of the heating element, increasing the amount of current flowing through the heating element, or both. However, electromigration limits the amount of current that can flow through a conductor. Heat energy flows through a given material at a rate according to the heat flux equation: $\Phi_Q \approx k(\Delta T/d)$; where k is thermal conductivity (a low thermal conductivity inhibits convection), d is the diffusion distance, and $\Delta T$ is the temperature delta between the warm area and the cooler area.

The integration of a heating element and an antifuse into a single structure provides substantial advantages over conventional antifuse structures. First, according the heat flux equation, the structures of the present invention experience no reduction in heat flow as a result of indirect heating. Because the heating element is integrated into the antifuse upper conductor, the antifuse lower conductor, or both, the antifuse dielectric layer is heated directly, and thus, heat energy does not flow through an intermediary material as is the case in conventional structures. Conventional antifuse structures having heating elements require that the heating element be separate and isolated from the antifuse structure by an intermediary material such as an insulating material. This intermediary material can be up to 0.5 micron thick and is typically not a good thermal conductor. Thus, according to the heat flux equation, the rate at which heat energy flows to a conventional antifuse structure will be reduced proportionally by the thermal conductivity of the intermediary material and the thickness of the material. For an insulating intermediary material having a thickness of 0.5 micron, the reduction in the rate at which heat energy flows through the intermediary material can be substantial. Second, because the antifuse structures of the present invention integrate a heating element and an antifuse conductor(s) into a single element, the novel structures of the present invention are simpler and more efficient, and thus, require less processing and minimally impact the overall size of the integrated circuit on which the antifuse structures are incorporated.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A programmable circuit, comprising:
   a semiconductor substrate;
   an antifuse formed on said semiconductor substrate, said antifuse including a first conductor having a first planar surface, a planar dielectric layer contacting said first planar surface of said first conductor, and a second conductor having a second planar surface that contacts said planar dielectric layer;
   a first conductive element contacting a first portion of said second conductor and electrically isolated from said first conductor;
   a second conductive element contacting a second portion of said second conductor and not contacting said first conductive element and electrically isolated from said first conductor; and
   means for applying a voltage difference across said first conductive element and said second conductive element, wherein said voltage difference induces a current I to flow in said second conductor and causes Joule heating of said second conductor.

2. The programmable circuit of claim 1, wherein said antifuse further comprises insulating spacers located directly on at least one sidewall of said second conductor.

3. The programmable circuit of claim 1, wherein said semiconductor substrate comprises a doped section of a semiconductor substrate.

4. The programmable circuit of claim 1, wherein said first conductor is located within said semiconductor substrate.

5. The programmable circuit of claim 1, wherein an entirety of said planar dielectric layer is located between, and does not extend outside, a plane of said first planar surface and a plane of said second planar surface.

6. The programmable circuit of claim 1, wherein said entirety of said planar dielectric layer has a same thickness throughout, and said same thickness is the same as a distance between said plane of said first planar surface and said plane of said second planar surface.

7. The programmable circuit of claim 1, wherein said first conductive element and said second conductive element are located above a top surface of said semiconductor substrate.

8. The programmable circuit of claim 1, wherein said means for applying said voltage difference is configured to apply said voltage difference for a duration of time.

9. The programmable circuit of claim 1, wherein said antifuse further comprises insulating spacers located directly on at least one sidewall of said first conductor.

10. The programmable circuit of claim 1, wherein said first conductor is located above said semiconductor substrate.

11. The programmable circuit of claim 4, further comprising a third conductor contacting a top surface of said first conductor.

12. The programming circuit of claim 4, wherein said first conductor extends to a top surface of said semiconductor substrate.

13. The programming circuit of claim 12, wherein said first conductor is a doped region of said semiconductor substrate.

14. The programming circuit of claim 4, further comprising an isolation layer comprising a dielectric material, embedded within said semiconductor substrate, and laterally surrounding said first conductor.

15. The programming circuit of claim 14, wherein said second conductor contacts a top surface of said isolation layer.

16. The programming circuit of claim 13, wherein a bottom surface of said first conductive element and a bottom surface of said second conductive element contact a top surface of said isolation layer.

17. The programmable circuit of claim 10, further comprising a contact structure contacting a top surface of said first conductor.

18. The programming circuit of claim 10, wherein said second conductor is located within said semiconductor substrate, and extends to a top surface of said semiconductor substrate.

19. The programming circuit of claim 10, further comprising an isolation layer comprising a dielectric material, embedded within said semiconductor substrate, and laterally surrounding said second conductor.

20. The programming circuit of claim 19, wherein said first conductor contacts a top surface of said isolation layer, and a bottom surface of said first conductive element and a bottom surface of said second conductive element contact a top surface of said isolation layer.

* * * * *